(12) United States Patent
Campbell et al.

(10) Patent No.: US 8,472,182 B2
(45) Date of Patent: Jun. 25, 2013

(54) APPARATUS AND METHOD FOR FACILITATING DISSIPATION OF HEAT FROM A LIQUID-COOLED ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 12/845,374

(22) Filed: Jul. 28, 2010

(65) Prior Publication Data

US 2012/0026691 A1 Feb. 2, 2012

(51) Int. Cl.
*H05K 7/20* (2006.01)

(52) U.S. Cl.
USPC ...... 361/679.49; 361/690; 361/698; 454/184; 62/259.2

(58) Field of Classification Search
USPC ....... 361/679.46–679.54, 676–678, 688–690, 361/694–702
See application file for complete search history.

(56) References Cited

U.S. PATENT DOCUMENTS

| | | | |
|---|---|---|---|
| 3,578,014 A | 5/1971 | Gachot | |
| 4,430,866 A | 2/1984 | Willitts | |
| 4,698,728 A | 10/1987 | Tustaniwskyj et al. | |
| 5,269,146 A | 12/1993 | Kerner | |
| 5,285,347 A | 2/1994 | Fox et al. | |
| 5,323,847 A | 6/1994 | Koizumi et al. | |
| 5,552,960 A | 9/1996 | Nelson et al. | |
| 5,718,628 A * | 2/1998 | Nakazato et al. | 454/184 |
| 5,731,954 A | 3/1998 | Cheon | |
| 5,782,101 A | 7/1998 | Dennis | |
| 5,829,264 A | 11/1998 | Ishigaki et al. | |
| 5,898,568 A | 4/1999 | Cheng | |

(Continued)

OTHER PUBLICATIONS

Campbell et al., Notice of Allowance for U.S. Appl. No. 12/845,355 (U.S. Patent Publication No. 2012/0024501 A1), dated Apr. 12, 2012.

(Continued)

*Primary Examiner* — Courtney Smith
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for facilitating cooling of one or more components of an electronics rack. The apparatus includes a liquid-cooled structure associated with the electronic component(s) to be cooled, and a liquid-to-air heat exchanger coupled in fluid communication with the liquid-cooled structure via a coolant loop to receive coolant from and supply coolant to the liquid-cooled structure. The heat exchanger is disposed external to the electronics rack within a cool air plenum of the data center containing the rack, and the plenum is coupled to a cool air source providing cooled air to the data center. Cooled air of the cool air plenum passes across the heat exchanger and cools coolant passing through the heat exchanger, which dissipates heat from the coolant passing therethrough to the cool air passing across the heat exchanger to facilitate liquid cooling of the electronic component(s) associated with the liquid-cooled structure.

19 Claims, 14 Drawing Sheets

U.S. PATENT DOCUMENTS

| | | | |
|---|---|---|---|
| 5,970,731 | A | 10/1999 | Hare et al. |
| 6,094,347 | A | 7/2000 | Bhatia |
| 6,161,612 | A | 12/2000 | Stahl et al. |
| 6,166,907 | A | 12/2000 | Chien |
| 6,212,895 | B1 | 4/2001 | Richardson |
| 6,275,945 | B1 | 8/2001 | Tsuji et al. |
| 6,276,448 | B1 | 8/2001 | Maruno |
| 6,353,536 | B1 | 3/2002 | Nakamura et al. |
| 6,374,627 | B1 | 4/2002 | Schumacher et al. |
| 6,459,575 | B1 | 10/2002 | Esterberg |
| 6,489,551 | B2 | 12/2002 | Chu et al. |
| 6,548,894 | B2 | 4/2003 | Chu et al. |
| 6,557,354 | B1 | 5/2003 | Chu et al. |
| 6,574,104 | B2 | 6/2003 | Patel et al. |
| 6,606,254 | B2 | 8/2003 | Yoneda |
| 6,616,524 | B2 | 9/2003 | Storck et al. |
| 6,687,123 | B2 | 2/2004 | Kitahara |
| 6,705,089 | B2 | 3/2004 | Chu et al. |
| 6,775,997 | B2 | 8/2004 | Bash et al. |
| 6,819,563 | B1 | 11/2004 | Chu et al. |
| 6,826,047 | B1 | 11/2004 | Chen et al. |
| 6,832,489 | B2 | 12/2004 | Bash et al. |
| 6,966,358 | B2 | 11/2005 | Rapaich |
| 6,967,842 | B2 | 11/2005 | Aoki et al. |
| 7,012,807 | B2 | 3/2006 | Chu et al. |
| 7,019,968 | B2 | 3/2006 | Kitahara |
| 7,068,509 | B2 | 6/2006 | Bash et al. |
| 7,088,585 | B2 | 8/2006 | Chu et al. |
| 7,106,590 | B2 | 9/2006 | Chu et al. |
| 7,120,021 | B2 | 10/2006 | Hamman |
| 7,143,605 | B2 | 12/2006 | Rohrer et al. |
| 7,149,084 | B2 | 12/2006 | Matsushima et al. |
| 7,174,738 | B2 | 2/2007 | Scott |
| 7,191,954 | B2 | 3/2007 | Kline |
| 7,203,063 | B2 | 4/2007 | Bash et al. |
| 7,222,502 | B2 | 5/2007 | Kobayashi et al. |
| 7,273,088 | B2 | 9/2007 | Malone et al. |
| 7,293,416 | B2 | 11/2007 | Ghoshal |
| 7,309,209 | B2 | 12/2007 | Amiot et al. |
| 7,315,448 | B1 * | 1/2008 | Bash et al. .................... 361/701 |
| 7,325,046 | B1 | 1/2008 | Novaes et al. |
| 7,349,213 | B2 | 3/2008 | Campbell et al. |
| 7,385,810 | B2 | 6/2008 | Chu et al. |
| 7,392,823 | B2 | 7/2008 | Dong et al. |
| 7,403,384 | B2 | 7/2008 | Pflueger |
| 7,420,808 | B2 | 9/2008 | Campbell et al. |
| 7,477,514 | B2 | 1/2009 | Campbell et al. |
| 7,531,142 | B2 | 5/2009 | Huziwara et al. |
| 7,559,207 | B2 | 7/2009 | Knight et al. |
| 7,599,184 | B2 | 10/2009 | Upadhya et al. |
| 7,630,795 | B2 | 12/2009 | Campbell et al. |
| 7,647,787 | B2 | 1/2010 | Belady et al. |
| 7,660,109 | B2 | 2/2010 | Iyengar et al. |
| 7,743,614 | B2 | 6/2010 | Goenka et al. |
| 7,866,164 | B2 | 1/2011 | Rice |
| 8,035,972 | B2 | 10/2011 | Ostwald et al. |
| 8,051,671 | B2 * | 11/2011 | Vinson et al. ................. 62/259.2 |
| 2002/0015287 | A1 | 2/2002 | Shao |
| 2002/0105783 | A1 | 8/2002 | Kitahara |
| 2003/0188538 | A1 | 10/2003 | Chu et al. |
| 2003/0214785 | A1 * | 11/2003 | Perazzo ........................ 361/695 |
| 2003/0218865 | A1 | 11/2003 | Macias |
| 2004/0008483 | A1 | 1/2004 | Cheon |
| 2004/0025516 | A1 | 2/2004 | Van Winkle |
| 2004/0065105 | A1 * | 4/2004 | Bash et al. .................... 62/259.2 |
| 2004/0099747 | A1 * | 5/2004 | Johnson et al. ............... 236/49.3 |
| 2004/0221604 | A1 | 11/2004 | Ota et al. |
| 2005/0068728 | A1 | 3/2005 | Chu et al. |
| 2005/0244280 | A1 | 11/2005 | Malone et al. |
| 2006/0037739 | A1 | 2/2006 | Utsunomiya |
| 2006/0082966 | A1 | 4/2006 | Lev et al. |
| 2006/0137359 | A1 | 6/2006 | Ghoshal |
| 2006/0137360 | A1 | 6/2006 | Ghoshal |
| 2006/0180300 | A1 | 8/2006 | Lenehan et al. |
| 2006/0187638 | A1 | 8/2006 | Vinson et al. |
| 2007/0119569 | A1 | 5/2007 | Campbell et al. |
| 2007/0121295 | A1 | 5/2007 | Campbell et al. |
| 2007/0274043 | A1 * | 11/2007 | Shabany ....................... 361/696 |
| 2007/0297136 | A1 | 12/2007 | Konshak |
| 2008/0141703 | A1 | 6/2008 | Bean, Jr. |
| 2008/0205003 | A1 | 8/2008 | Belady |
| 2008/0259566 | A1 | 10/2008 | Fried |
| 2009/0080173 | A1 | 3/2009 | Schmidt et al. |
| 2009/0126909 | A1 * | 5/2009 | Ellsworth et al. ......... 165/104.33 |
| 2009/0126910 | A1 | 5/2009 | Campbell et al. |
| 2009/0133866 | A1 | 5/2009 | Campbell et al. |
| 2009/0156114 | A1 | 6/2009 | Ahladas et al. |
| 2009/0161312 | A1 * | 6/2009 | Spearing et al. ......... 361/679.47 |
| 2009/0249796 | A1 | 10/2009 | Ullman |
| 2010/0000229 | A1 | 1/2010 | Tindale et al. |
| 2010/0101759 | A1 | 4/2010 | Campbell et al. |
| 2010/0101765 | A1 | 4/2010 | Campbell et al. |
| 2010/0170663 | A1 | 7/2010 | Bean, Jr. |
| 2011/0277967 | A1 | 11/2011 | Fried et al. |
| 2011/0303394 | A1 * | 12/2011 | Branton .................... 165/104.33 |
| 2012/0024501 | A1 | 2/2012 | Campbell et al. |
| 2012/0111028 | A1 * | 5/2012 | Campbell et al. ................ 62/3.7 |

OTHER PUBLICATIONS

Campbell et al., "System and Method for Facilitating Parallel Cooling of Liquid-Cooled Electronics Racks", U.S. Appl. No. 12/556,053, filed Sep. 9, 2009.

Campbell et al., "Condenser Structures with Fin Cavities Facilitating Vapor Condensation Cooling of Coolant", U.S. Appl. No. 12/491,287, filed Jun. 25, 2009.

Schmidt et al., "Challenges of Data Center Thermal Management", IBM Journal of Research & Development, vol. 49, No. 4/5, pp. 709-723 (Jul./Sep. 2005).

Zamanabadi et al., "Hybrid Control Challenges in Refrigeration Systems", Danfoss A/S, Denmark, Advanced Engineering—Refrigeration and Air Conditioning, EECI (2007).

Bilski et al., "Electronics Cooling of a Self-Contained, Sub-Cooled Pumped Liquid System", 24th IEEE Semi-Therm Symposium, pp. 137-141 (Jul. 2008).

Ellsworth, Jr. et al., "The Evolution of Water Cooling for IBM Larger Server Systems: Back to the Future", IBM Corporation, Poughkeepsie, NY (2008).

Simons et al., "Application of Thermoelectric Cooling to Electronic Equipment: A Review and Analysis", IBM Corporation, Poughkeepsie, NY (2000).

Torok et al., "Packaging Design of the IBM System z10 Enterprise Class Platform Central Electronic Complex", IBM Journal of Research & Development, vol. 53, No. 1, Paper 9 (2009).

\* cited by examiner

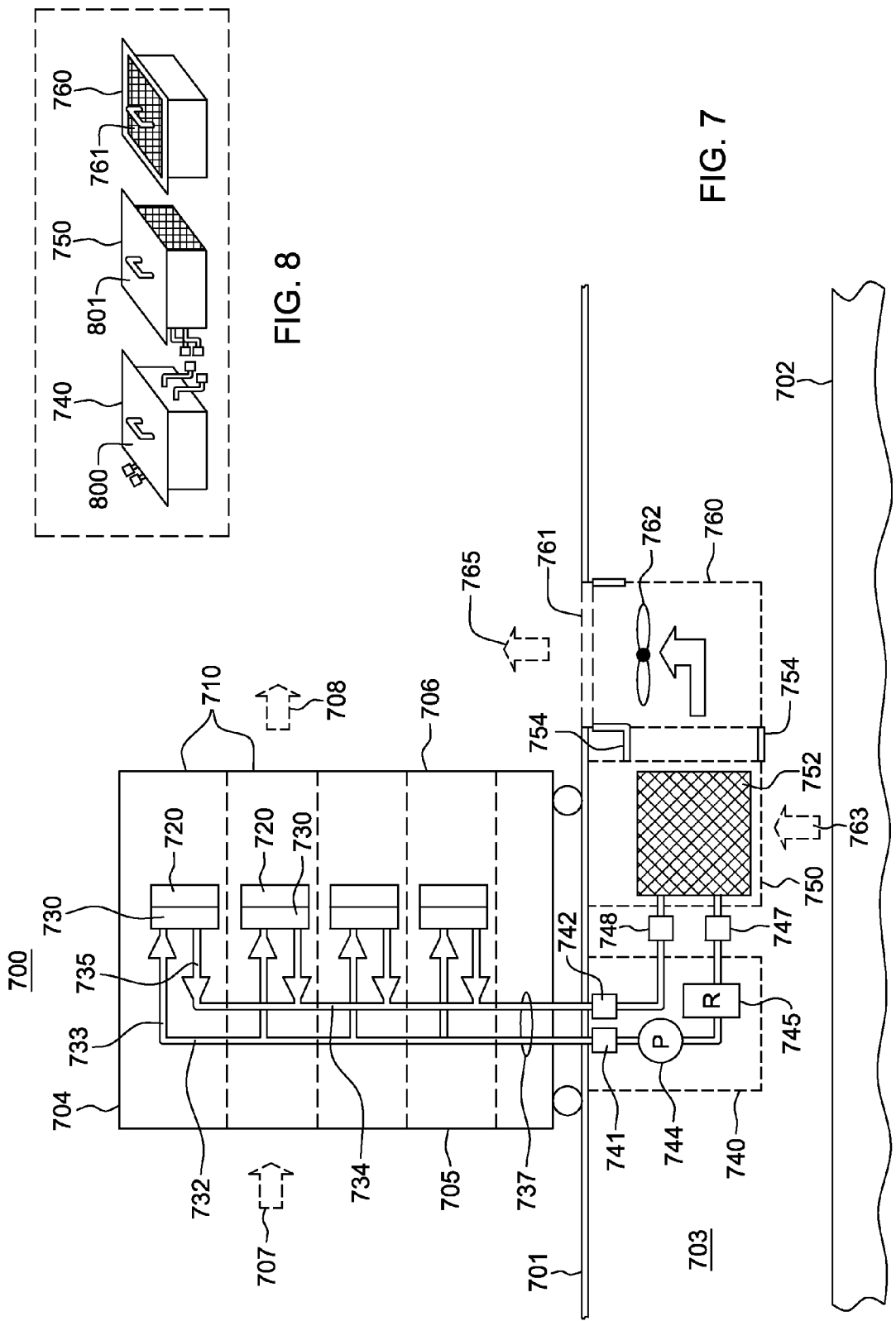

US 8,472,182 B2

APPARATUS AND METHOD FOR FACILITATING DISSIPATION OF HEAT FROM A LIQUID-COOLED ELECTRONICS RACK

BACKGROUND

The present invention relates to heat transfer mechanisms, and more particularly, to cooling apparatuses, liquid-cooled electronics racks and methods of fabrication thereof for removing heat generated by one or more electronic components of the electronics rack.

The power dissipation of integrated circuit chips, and the modules containing the chips, continues to increase in order to achieve increases in processor performance. This trend poses a cooling challenge at both the module and system levels. Increased airflow rates are needed to effectively cool higher power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device(s) or by increasing the rotational speed (i.e., RPMs) of an existing air moving device. However, this approach is becoming problematic at the rack level in the context of a data center.

BRIEF SUMMARY

In one aspect, the shortcomings of the prior art are overcome and additional advantages are provided through the provision of an apparatus for facilitating cooling of an electronics rack. The apparatus includes: at least one liquid-cooled structure associated with at least one electronic component of the electronics rack, and at least one liquid-to-air heat exchanger. The at least one liquid-to-air heat exchanger is coupled in fluid communication with the at least one liquid-cooled structure via a coolant loop for receiving heated coolant after passing through the at least one liquid-cooled structure. The at least one liquid-to-air heat exchanger is disposed external to the electronics rack within a cool air plenum, wherein the cool air plenum is coupled to an air-cooling source and receives cooled air therefrom. The cooled air within the cool air plenum passes across the at least one liquid-to-air heat exchanger, and the at least one liquid-to-air heat exchanger cools coolant passing therethrough, and dissipates heat from the coolant passing therethrough to the cooled air passing thereacross.

In another aspect, a data center is provided which includes an electronics rack, a cool air plenum, and an apparatus for facilitating cooling of at least one electronic component of the electronics rack. The cool air plenum includes one of an underfloor plenum or an overhead plenum providing cooled air to the data center. The cool air plenum is coupled to an air-cooling source for the data center and receives cooled air therefrom. The apparatus includes at least one liquid-cooled structure associated with the at least one electronic component of the electronics rack, and at least one liquid-to-air heat exchanger coupled in fluid communication with the at least one liquid-cooled structure via a coolant loop for receiving heated coolant after passing through the at least one liquid-cooled structure. The at least one liquid-to-air heat exchanger is configured for disposition external to the electronics rack within the cool air plenum coupled to the air-cooling source. In operation, cooled air within the cool air plenum passes across the at least one liquid-cooled heat exchanger, and the at least one liquid-to-air heat exchanger cools coolant passing therethrough, and dissipates heat from the coolant passing therethrough to the cooled air passing thereacross.

In a further aspect, a method of facilitating cooling of an electronics rack is provided. The method includes: disposing at least one tile assembly external to the electronics rack, the at least one tile assembly defining, in part, a cool air plenum of a data center containing the electronics rack, and comprising at least one liquid-to-air heat exchanger extending away from a tile thereof into the cool air plenum; associating at least one liquid-cooled structure with at least one electronic component of the electronics rack to facilitate removal of heat therefrom via liquid coolant passing therethrough, and coupling in fluid communication, via a coolant loop, the at least one liquid-cooled structure and the at least one liquid-to-air heat exchanger, wherein the at least one liquid-to-air heat exchanger receives coolant from and supplies coolant to the at least one liquid-cooled structure; and wherein in operation, cool air of the cool air plenum passes across the at least one liquid-to-air heat exchanger, and the at least one liquid-to-air heat exchanger cools coolant passing therethrough by dissipating heat from the coolant passing therethrough to the cooled air passing thereacross.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 7 is a cross-sectional elevation illustration of one embodiment of an electronics rack within a raised floor data center and an apparatus for facilitating cooling of one or more components of the electronics rack, in accordance with an aspect of the present invention;

FIG. 8 is an isometric view of one embodiment of the modular tile assemblies of a cooling apparatus such as depicted in FIG. 7, in accordance with an aspect of the present invention;

DETAILED DESCRIPTION

Figure 1:
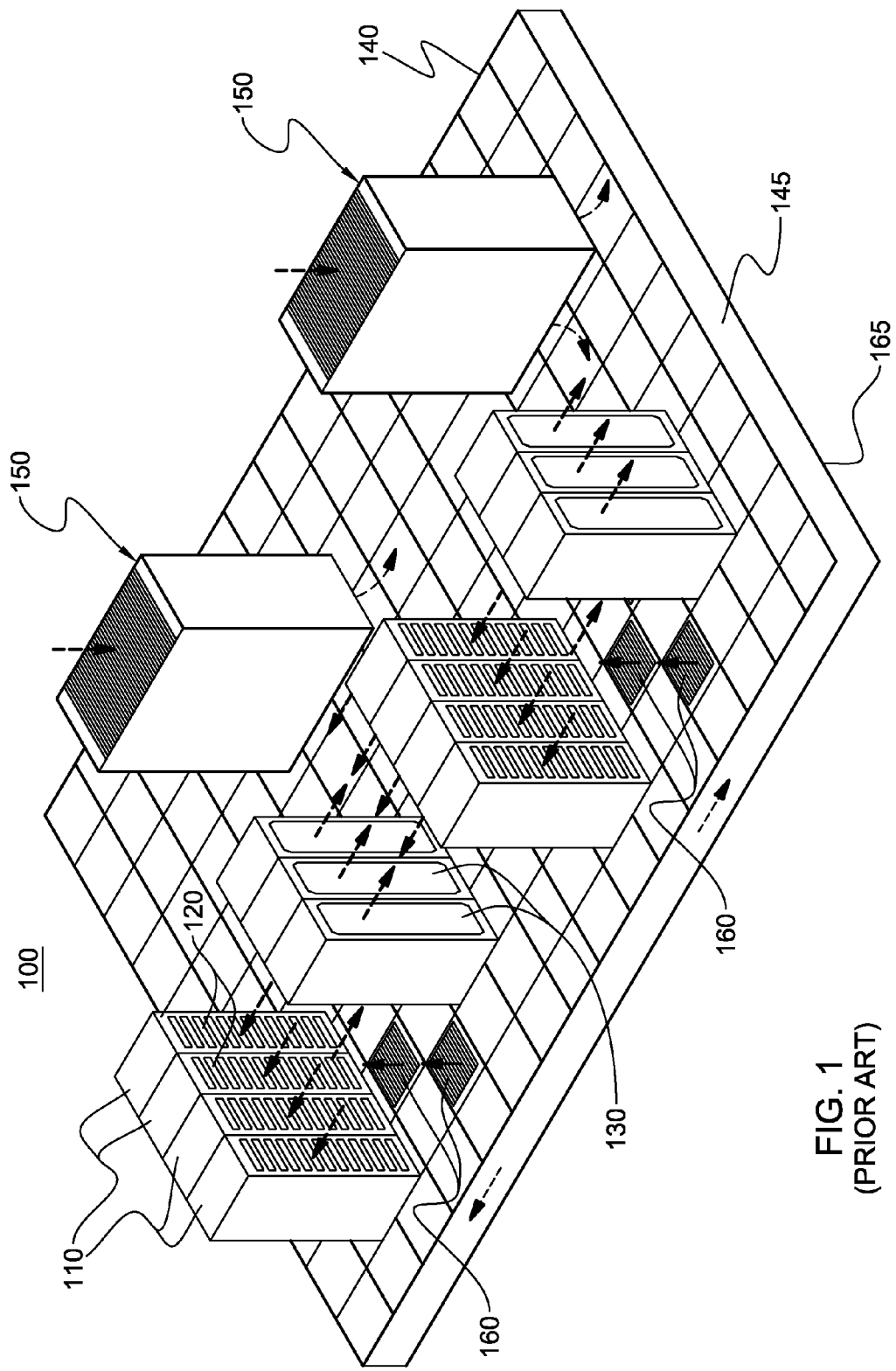
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, an electronic component may comprise one or more bare dies or one or more packaged dies disposed on a common carrier. As used herein, "primary heat generating component" refers to a primary heat generating electronic component within an electronics subsystem, while "secondary heat generating component" refers to an electronic component of the electronics subsystem generating less heat than the primary heat generating component to be cooled. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "liquid-to-air heat exchanger" means any heat exchange mechanism characterized as described herein through which liquid coolant can circulate; and includes, one or more discrete liquid-to-air heat exchange mechanisms coupled either in series or in parallel. A liquid-to-air heat exchanger may comprise, for example, one or more coolant flow paths, formed of thermally conductive tubing (such as copper or other tubing) in thermal or mechanical contact with a plurality of air-cooled cooling fins. Size, configuration and construction of the liquid-to-air heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of a liquid coolant (for example, the facility or system coolants discussed below) is water. However, the concepts disclosed herein are readily adapted to use with other types of coolant. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, cooled air enters the data center via perforated floor tiles 160 from a cool air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the data center. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Due to the ever-increasing airflow requirements through electronics racks, and the limits of air distribution within the typical data center installation, liquid-assisted cooling is being combined with the conventional air-cooling. FIGS. 2-6 illustrate one embodiment of a data center implementation employing a liquid-assisted cooling system with one or more cold plates coupled to high heat-generating electronic components disposed within the electronics racks.

Figure 2:
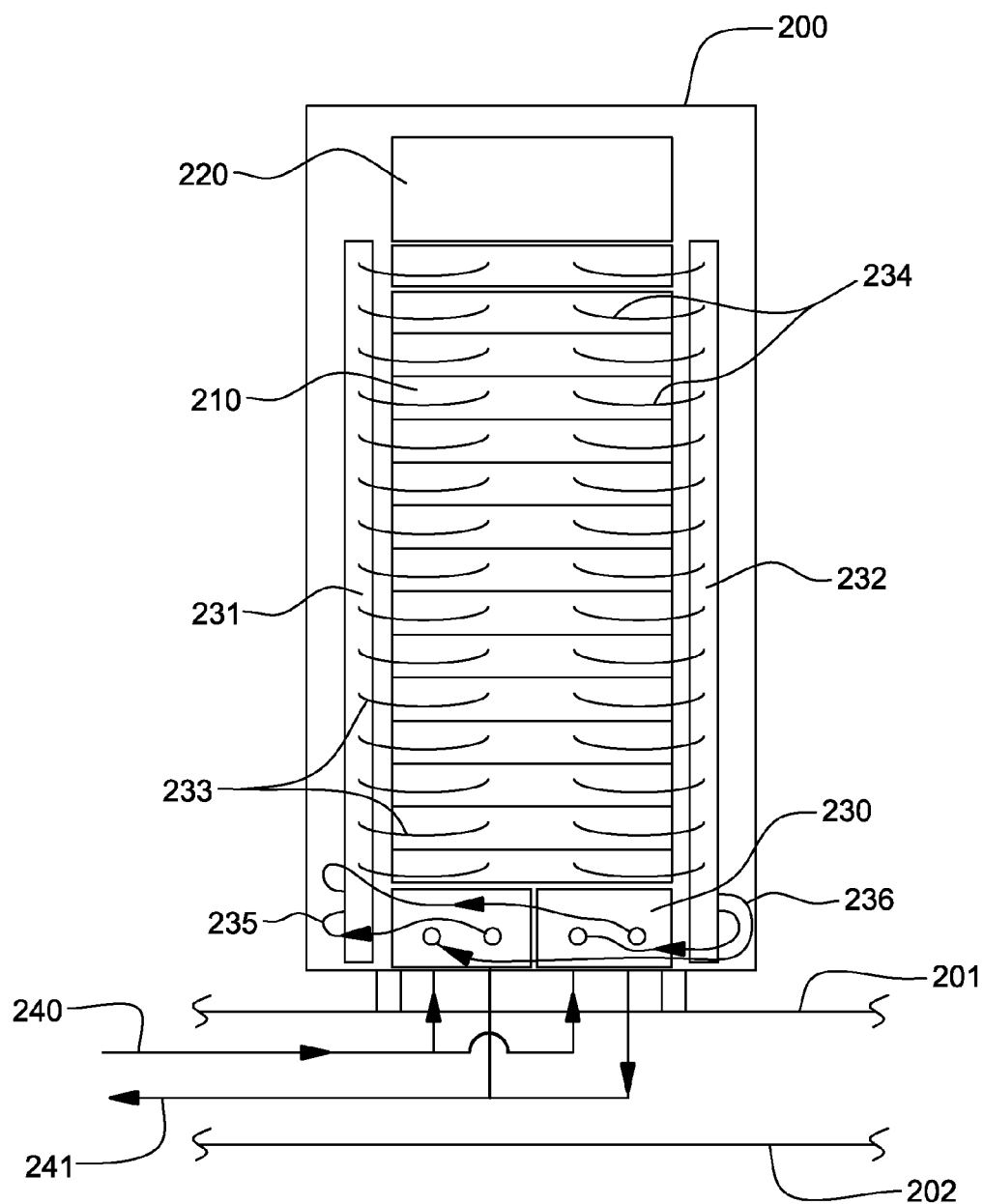
FIG. 2 is a front elevational view of one embodiment of an at least partially liquid-cooled electronics rack comprising multiple electronics subsystems, in accordance with one aspect of the present invention.

FIG. 2 depicts one embodiment of a partially liquid-cooled electronics rack 200. As illustrated, liquid-cooled electronics rack 200 comprises a plurality of electronics subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In the embodiments described herein, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronics subsystems 210, and node-to-manifold fluid connect hoses 234 coupling the individual electronics subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronics subsystems is transferred from the system water to cooler facility water supplied by facility water supply line 240 and facility water return line 241 disposed, in the illustrated embodiment, in the space between a raised floor 201 and a base floor 202.

Figure 3:
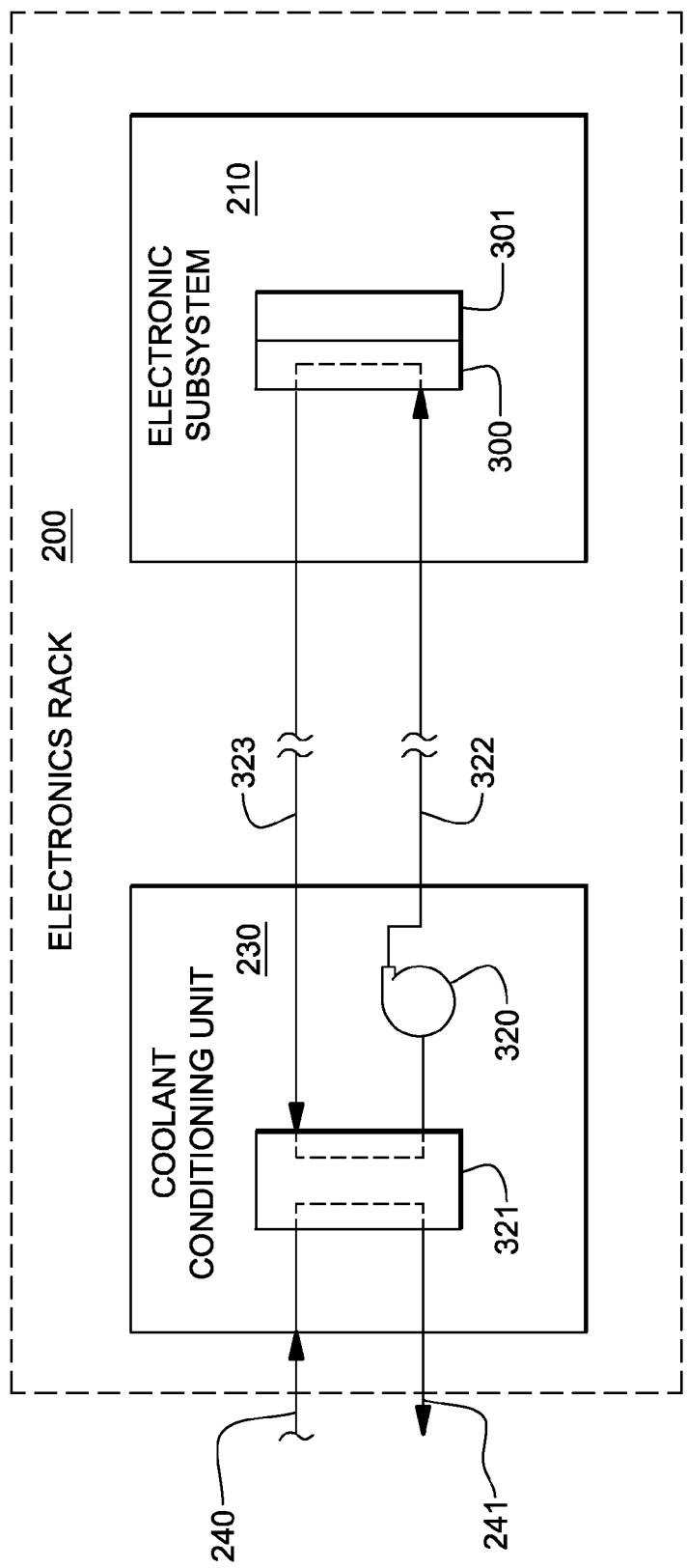
FIG. 3 is a schematic of one embodiment of an electronics rack, wherein an electronics module (or component) is liquid-cooled by system coolant (provided by one or more coolant conditioning units disposed within the electronics rack) passing through a liquid-cooled structure coupled to the electronics module, in accordance with an aspect of the present invention.

FIG. 3 schematically illustrates operation of the cooling system of FIG. 2, wherein a liquid-cooled cold plate 300 is shown coupled to an electronics module 301 of an electronics subsystem 210 within the liquid-cooled electronics rack 200. Heat is removed from electronics module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronics module(s). Furthermore, the system coolant is physically separate from the less controlled facility coolant in lines 240, 241, to which heat is ultimately transferred.

Figure 4:
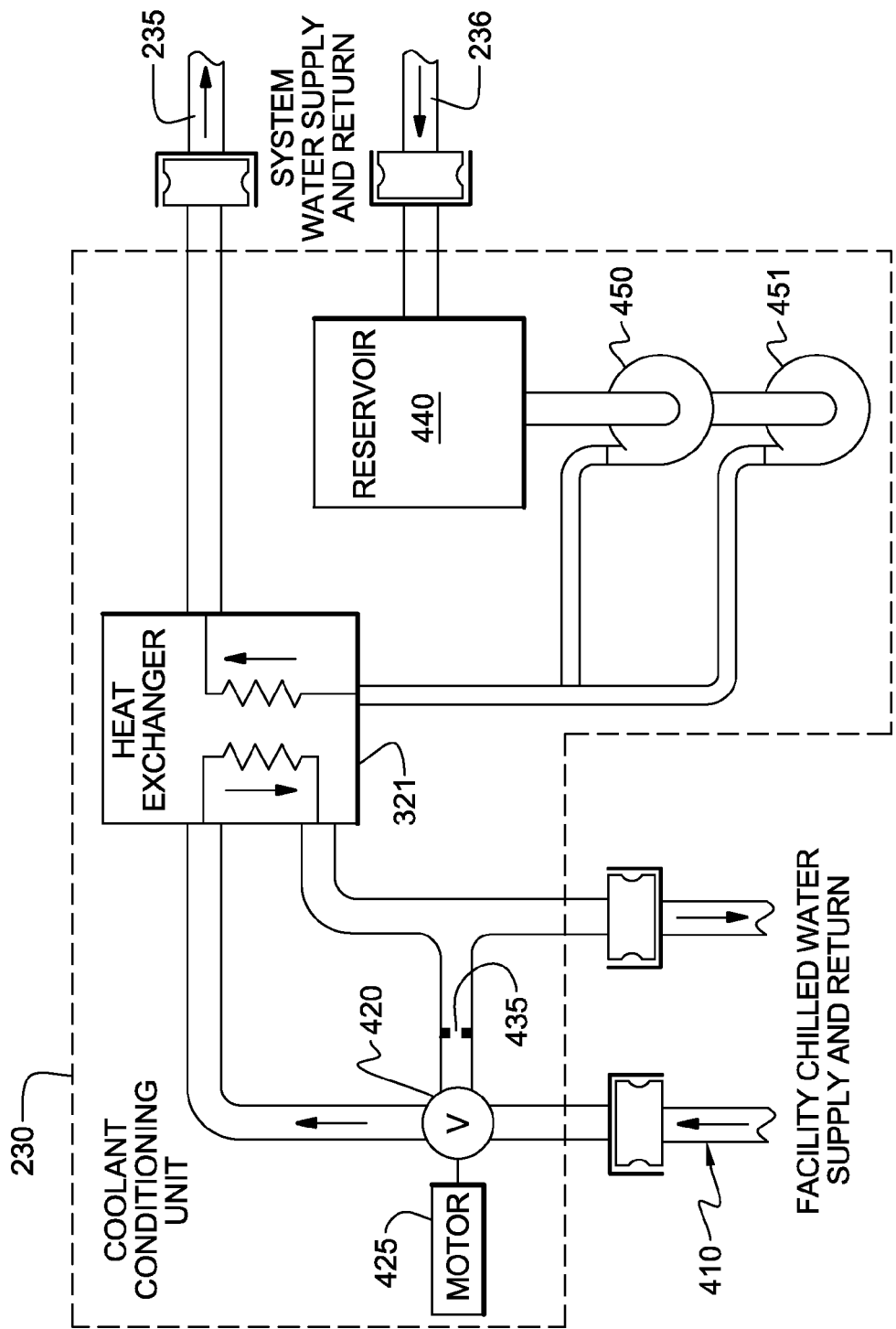
FIG. 4 is a schematic of one embodiment of a coolant conditioning unit disposed within a liquid-cooled electronics rack, in accordance with one aspect of the present invention.

FIG. 4 depicts a more detailed embodiment of a coolant conditioning unit 230. As shown in FIG. 4, coolant conditioning unit 230 includes a first cooling loop wherein building chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second cooling loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and system water return manifold of the liquid-cooled electronics rack via the system water supply hose 235 and system water return hose 236.

Figure 5:
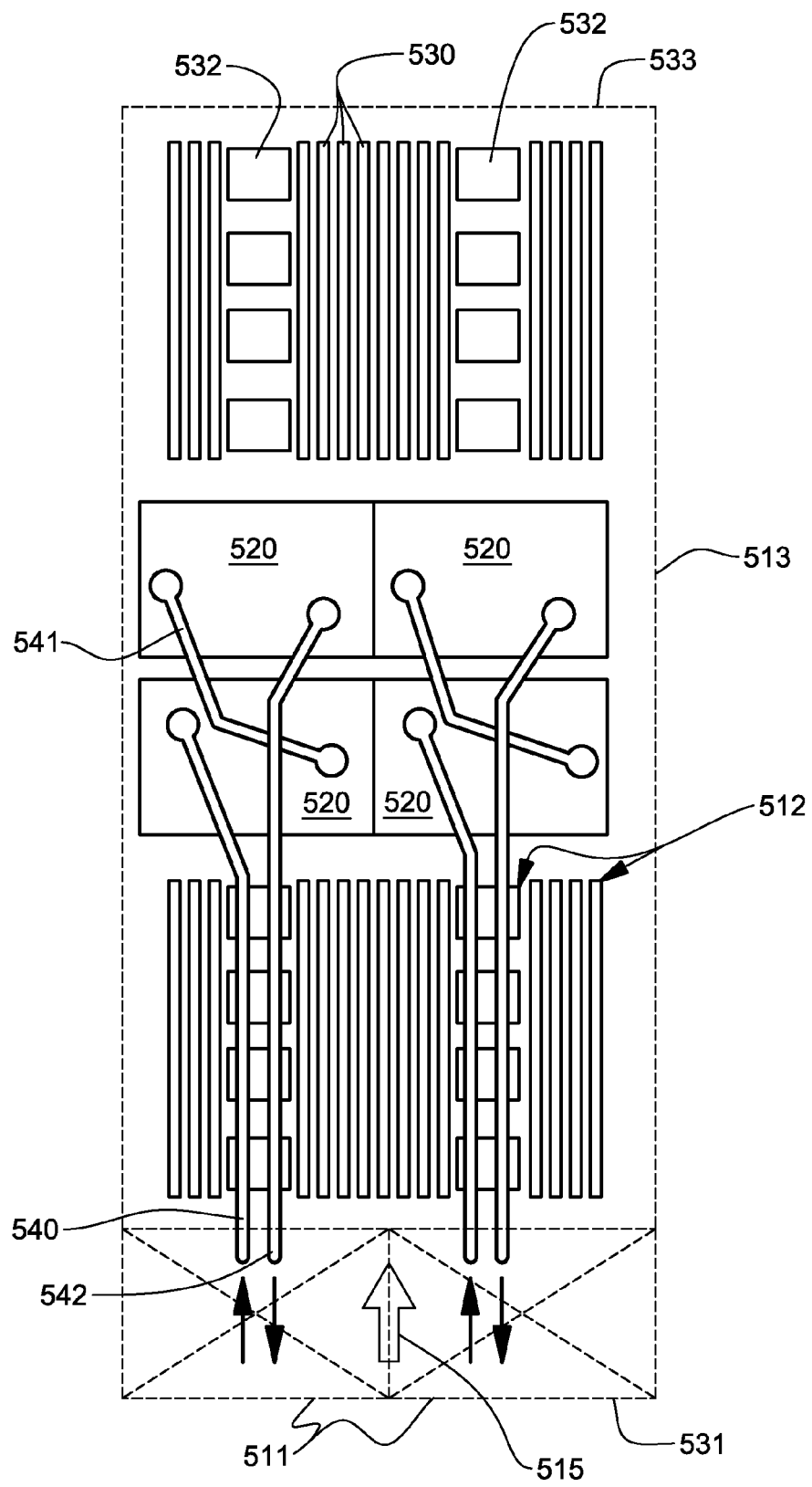
FIG. 5 is a plan view of one embodiment of an electronics subsystem layout illustrating an air and liquid cooling system for cooling components of the electronics subsystem, in accordance with an aspect of the present invention.

FIG. 5 depicts one embodiment of an electronics subsystem 513 component layout wherein one or more air moving devices 511 provide forced air flow 515 to cool multiple components 512 within electronics subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMNIs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronics subsystem 513, and partially arrayed near back 533 of electronics subsystem 513. Also, in the embodiment of FIG. 5, memory modules 530 and the memory support modules 532 are cooled by air flow 515 across the electronics subsystem.

The illustrated liquid-based cooling system further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
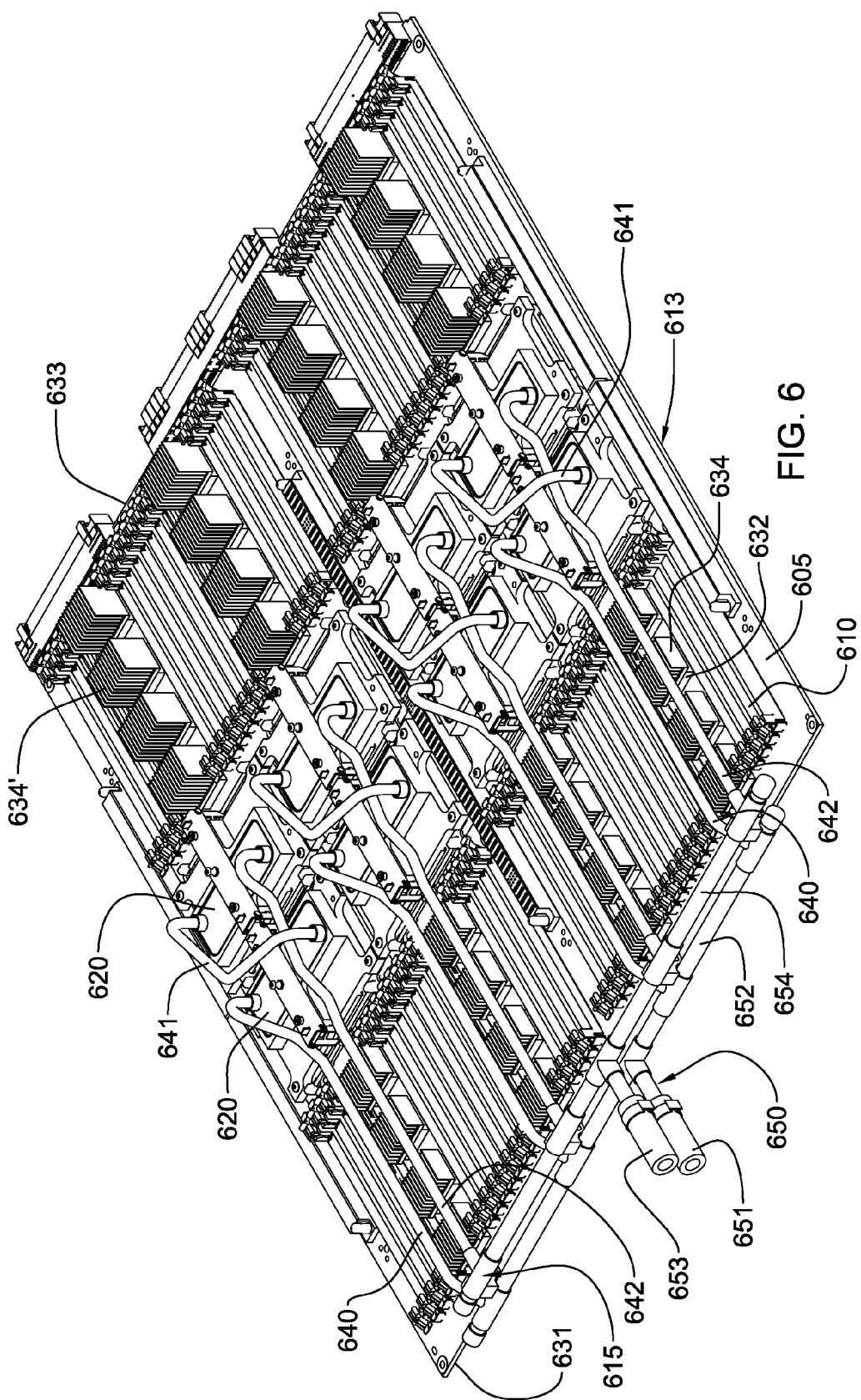
FIG. 6 depicts one detailed embodiment of a partially-assembled electronics subsystem layout, wherein the electronics subsystem includes eight heat-generating electronics components to be actively cooled, each having a respective liquid-cooled structure of a liquid-based cooling system coupled thereto, in accordance with an aspect of the present invention.

FIG. 6 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desireable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein in one aspect is a robust and reliable liquid-assisted cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 6 depicts a partially assembled electronics system 613 and an assembled liquid-based cooling system 615 coupled to primary heat generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the liquid-cooled cold plates 620 of the liquid-based cooling system 615.

In addition to liquid-cooled cold plates 620, liquid-based cooling system 615 includes multiple coolant-carrying tubes, including coolant supply tubes 640 and coolant return tubes 642 in fluid communication with respective liquid-cooled cold plates 620. The coolant-carrying tubes 640, 642 are also connected to a header (or manifold) subassembly 650 which facilitates distribution of liquid coolant to the coolant supply tubes and return of liquid coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Liquid-based cooling system 615 comprises a pre-configured monolithic structure which includes multiple (pre-assembled) liquid-cooled cold plates 620 configured and disposed in spaced relation to engage respective heat generating electronic components. Each liquid-cooled cold plate 620 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two liquid manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 652. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described liquid cooling approach of FIGS. 2-6 is an effective solution for circulating water through liquid-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, are disposed within each electronics rack. As explained above, heat load carried by the system coolant circulating through the liquid-cooled components in the liquid-cooled electronics rack is rejected to facility chilled water passing through the second coolant path through the active water-to-water heat exchangers within the coolant conditioning units disposed within the rack units.

Disclosed hereinbelow are alternative implementations of a hybrid, liquid-assisted, air-cooled electronics rack for a data center. These implementations may be advantageously employed in a data center lacking facility-chilled water.

FIG. 7 illustrates one embodiment of a raised floor data center 700, employing one or more liquid-cooled electronics racks 704, similar to those described above in connection with FIGS. 2-6, but without a coolant-conditioning unit disposed within the rack. Data center 700 is a raised floor data center, wherein a raised floor 701 is spaced above a base (or sub-floor) 702 of the room to define a cool air plenum 703. Although not shown, raised floor 701 is conventionally established via a plurality of struts extending vertically upwards from the base floor 702 to an interconnected grid support structure configured to receive floor tiles, which taken together, define raised floor 701. Within liquid-cooled electronics rack 704, a plurality of electronic subsystems 710 are shown by way of example. Electronic subsystems 710 are air-cooled, with cool air 707 being taken in through an air inlet side 705 of the rack unit, and exhausted as heated air 708 back into the data center through an air outlet side 706 thereof. One or more electronic components within the electronics rack, for example, within each electronic subsystem 710 of the electronics rack, are liquid-cooled to assist with extraction of heat from the electronics rack. For example, one or more primary heat-generating components 720 within one or more electronic subsystems 710 may have associated therewith liquid-cooled structures 730, such as liquid-cooled cold plates. Alternatively, liquid-cooled structures 730 might comprise discrete housings, each surrounding one or more electronic components to be cooled within the electronics rack for immersion-cooling of selected components within a dielectric coolant.

In the illustrated embodiment of FIG. 7, the liquid-cooling apparatus further includes a coolant supply manifold 732 supplying cooled liquid coolant in parallel (via a plurality of coolant supply lines 733) to multiple liquid-cooled structures 730. Heat extracted via liquid-cooled structures 730 from the one or more electronic components 720 is removed in parallel via respective coolant return lines 735 and a coolant return manifold 734. In this implementation, the supply and return manifolds 732, 734 are vertically-oriented and couple via quick connects 741, 742, respectively, to a first modular tile assembly 740 which defines, in part, the cool air plenum 703. As shown, a pump 744 and a coolant reservoir 745 are provided as part of first modular tile assembly 740. In one implementation, these structures are part of the modular tile assembly such that removal of the modular tile assembly 740 from the raised floor structure 701 results in removal of the pump and reservoir as well. For example, the pump and reservoir may be affixed to a solid surface tile of the modular tile assembly 740. Modular tile assembly 740 further includes coolant lines which facilitate defining a coolant loop 737 between liquid-cooled structures 730 and a liquid-to-air heat exchanger 752 associated with a second modular tile assembly 750. Fluid connection between the coolant lines of first modular tile assembly 740 and liquid-to-air heat exchanger 752 of second modular tile assembly 750 is facilitated via respective quick connects 747, 748. By way of example, the quick connects or quick connect couplings 741, 742, 747, 748 may comprise any one of various types of commercially available quick connect couplings, such as those available from Colder Products, Company, of St. Paul, Minn., U.S.A., or Parker Hannifin, of Cleveland, Ohio, U.S.A.

In one implementation, first modular tile assembly 740 and second modular tile assembly 750 are adjacent to each other within the raised floor 701, with the pump and reservoir (in the case of the first modular tile assembly 740) and the liquid-to-air heat exchanger 752 (in the case of the second modular tile assembly 750) disposed below and extending away from respective solid surface tiles of the respective assemblies into cool air plenum 703.

In operation, cool air 763 within cool air plenum 703 passes across liquid-to-air heat exchanger 752, which cools the coolant passing therethrough by dissipating heat from the coolant passing through the heat exchanger to the cooled air passing thereacross. In this manner, heated coolant within coolant loop 737 is cooled by the air passing across the liquid-to-air heat exchanger 752. The modularity of the modular tile assemblies allows for individual removal and servicing of, for example, the first modular tile assembly 740 or the second modular tile assembly 750, with the appropriate quick connects 741, 742, 747 or 748 being employed to readily open (or complete) the coolant loop, as required.

The embodiment illustrated in FIG. 7 also comprises a third modular tile assembly 760, which includes an air-moving device 762, and one or more baffles 754 configured to facilitate directing airflow passing across liquid-to-air heat exchanger 752 of second modular tile assembly 750 through a perforated tile 761 of third modular tile assembly 760 back into data center 700 as exhaust air 765. In the illustrated implementation, this exhaust air 765 egresses into a hot air aisle of the data center at the air outlet side 706 of electronics rack 704. Although not illustrated, baffling 754 may extend to wrap around third modular tile assembly 760 and to project outward to mate with second modular tile assembly 750 to form a substantially closed airflow path to direct air passing across the liquid-to-air heat exchanger 752 towards the perforated tile 761.

In FIG. 8, the three modular tile assemblies 740, 750 & 760 illustrated in FIG. 7 are represented in simplified isometric view, by way of example only. As shown, first and second modular tile assemblies 740, 750 include solid surface tiles 800, 801, respectively, while third modular tile assembly 760 includes perforated tile 761 for allowing exhaust air to egress into the data center, for example, at a hot air aisle of the data center.

As one detailed example, the electronic component 720 described above may comprise one or more multichip processor modules, and the coolant being employed within the cooling apparatus can be water. Further, the liquid-cooled structure 730 may comprise a liquid-cooled cold plate. Advantageously, cool air within cool air plenum 703 is at a significantly lower temperature than the ambient air within the data center, and facilitates cooling of the coolant passing through the liquid-to-air heat exchanger 752. The modularized tile assembly approach depicted in the figures and described above advantageously facilitates servicing of the cooling apparatus, as well as integration of the apparatus into the data center, for example, in the vicinity of an electronics rack to be cooled. Should more heat exchangers or more air-moving devices be desired, then they can be readily configured for addition into the modularized cooling apparatus for a particular implementation. For example, two modular tile assemblies 750 could be coupled in parallel (or even in series) to provide additional cooling capacity. The apparatus described herein results in a hybrid cooling of the electronics rack, wherein airflow continues to provide cooling to many of the electronic components of the electronics rack, and the liquid-cooling apparatus facilitates extracting heat from certain higher (or primary) heat-generating electronic components within the electronics rack, such as processors within one or more of the individual electronic subsystems. The special modular tile assemblies described herein may be readily integrated into a raised floor structure, with the quick connect couplings employed for ready removal or replacement of one or more of the modular tile assemblies.

Figure 9A:
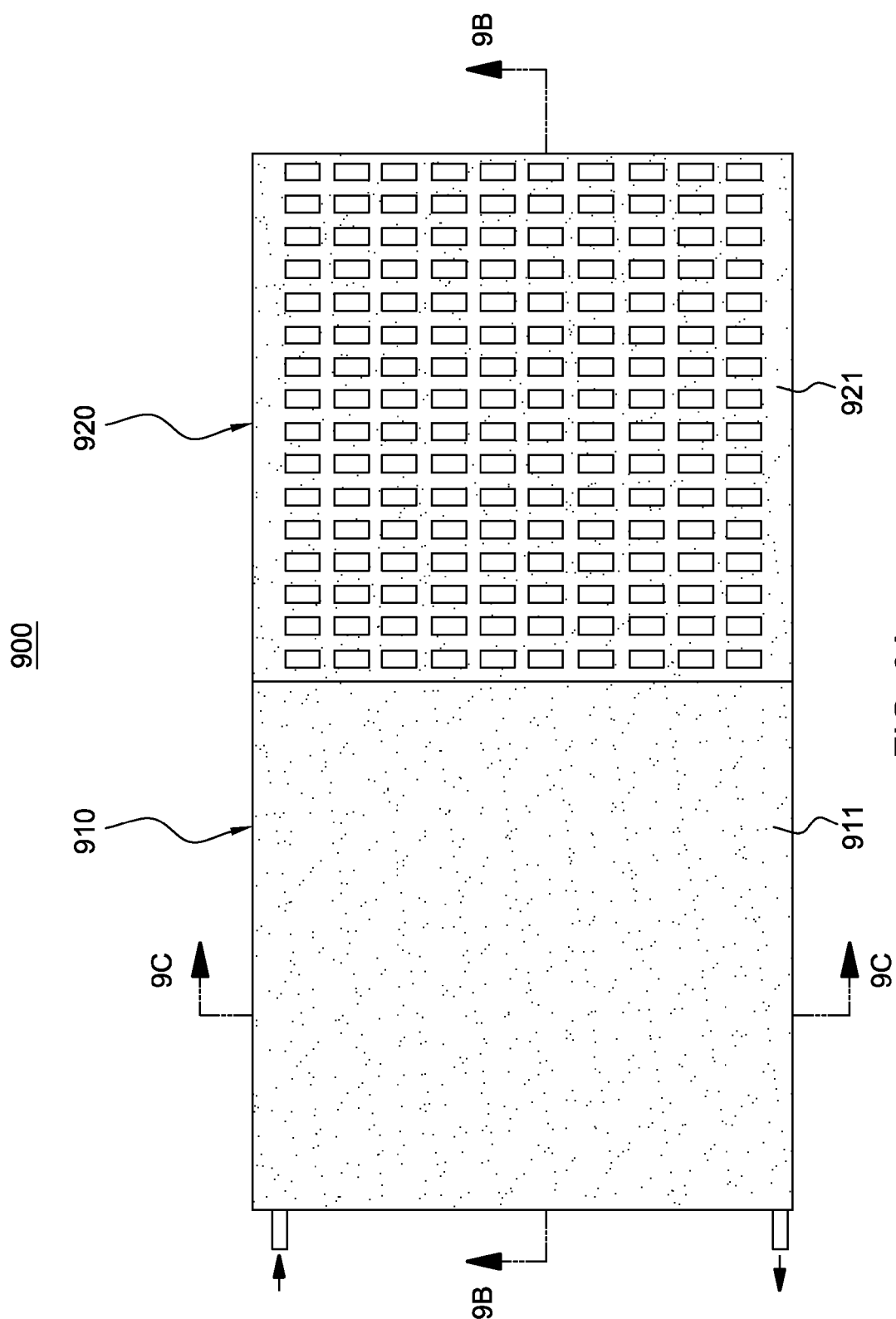
FIG. 9A is a plan view of one embodiment of two adjacent modular tile assemblies of a cooling apparatus such as illustrated in FIGS. 7 & 8, in accordance with an aspect of the present invention.
Figure 9B:
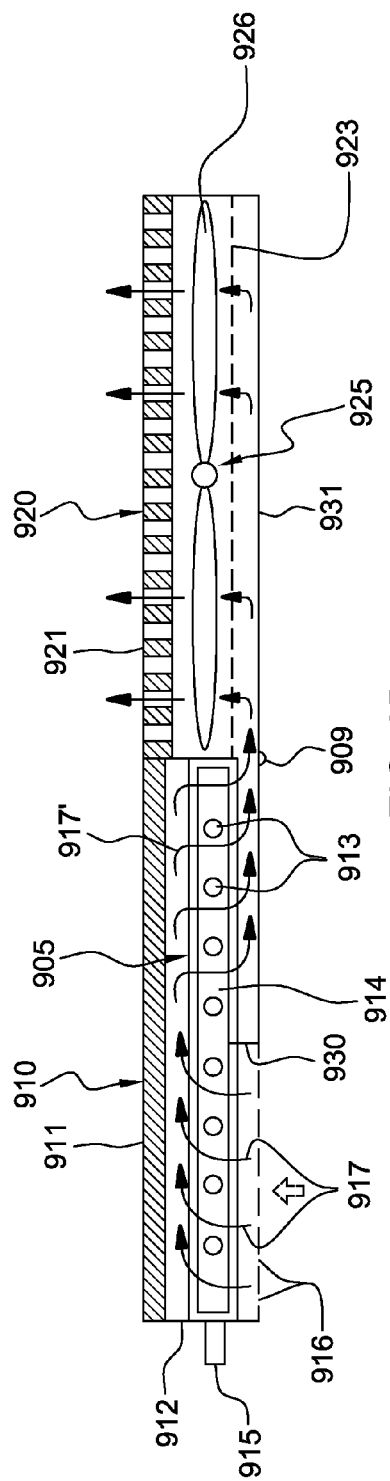
FIG. 9B is a cross-sectional elevational view of the two adjacent modular tile assemblies of FIG. 9A, taken along line 9B-9B thereof, in accordance with an aspect of the present invention.
Figure 9C:
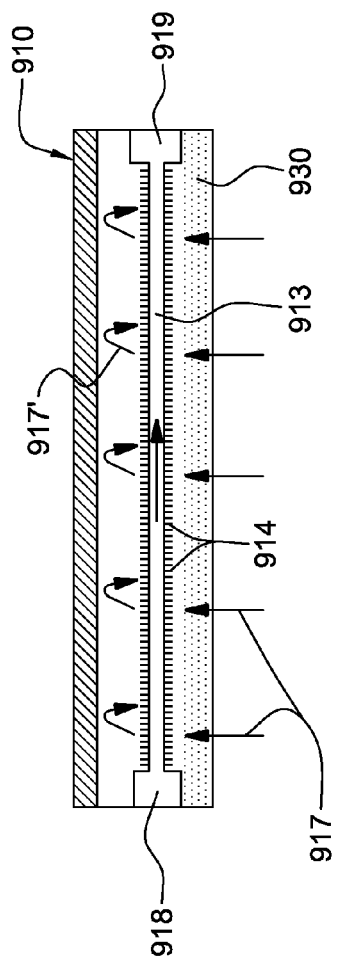
FIG. 9C is a cross-sectional elevational view of the two adjacent modular tile assemblies of FIG. 9A, taken along line 9C-9C thereof, in accordance with an aspect of the present invention.

FIGS. 9A-9C depict a more detailed implementation of one embodiment of a modular, tile-based heat exchange assembly 910 and a modular, tile-based air-moving device assembly disposed adjacent to each other, for example, within a raised floor of a raised floor data center 900.

As illustrated in FIGS. 9A-9C, modular tile-based heat exchange assembly 910 includes a solid surface tile 911 and a frame (or housing) 912 which supports a liquid-to-air heat exchanger 905 substantially in parallel with solid surface tile 911. Liquid-to-air heat exchanger 905 includes a plurality of coolant-carrying channels (or tubes) 913 between which a plurality of thermally conductive fins 914 extend. The plurality of coolant-carrying tubes 913 are in fluid communication at opposite ends with a coolant supply manifold 918 and a coolant return manifold 919. Coolant supply manifold 918 is, in one embodiment, coupled to a coolant inlet tube 915, and coolant return manifold 919 is coupled to a coolant outlet tube (not shown). In one example, these tubes facilitate coupling liquid-to-air heat exchanger 905 in fluid communication with the coolant loop 737 (FIG. 7). Cool air 917 within the cool air plenum is taken in through openings 916 in housing 912 and is turned 917' within the housing after passing across, for example, half of the liquid-to-air heat exchanger 905 to pass over the other half of the liquid-to-air heat exchanger 905. Appropriate air baffling 930 is provided to direct the exhaust air to the modular, tile-based air-moving device assembly 920. One or more gaskets 909 can be provided between the assemblies 910 & 920 to facilitate sealing the assemblies together and directing the exhaust air towards the modular, tile-based air-moving device assembly 920.

Assembly 920 includes a perforated tile 921 and an air-moving device 925 oriented with the blades 926 thereof extending in a plane substantially parallel to perforated tile 921. A screen 923 is provided enclosing air-moving device 925. Note that, depending upon the implementation, one (or more than one) air-moving device(s) may be incorporated into a single modular, tile-based air-moving device assembly 920. Appropriate baffling 931 is provided to facilitate directing of the exhaust air from modular, tile-based heat exchange assembly 910 towards air-moving device 925.

Figure 10:
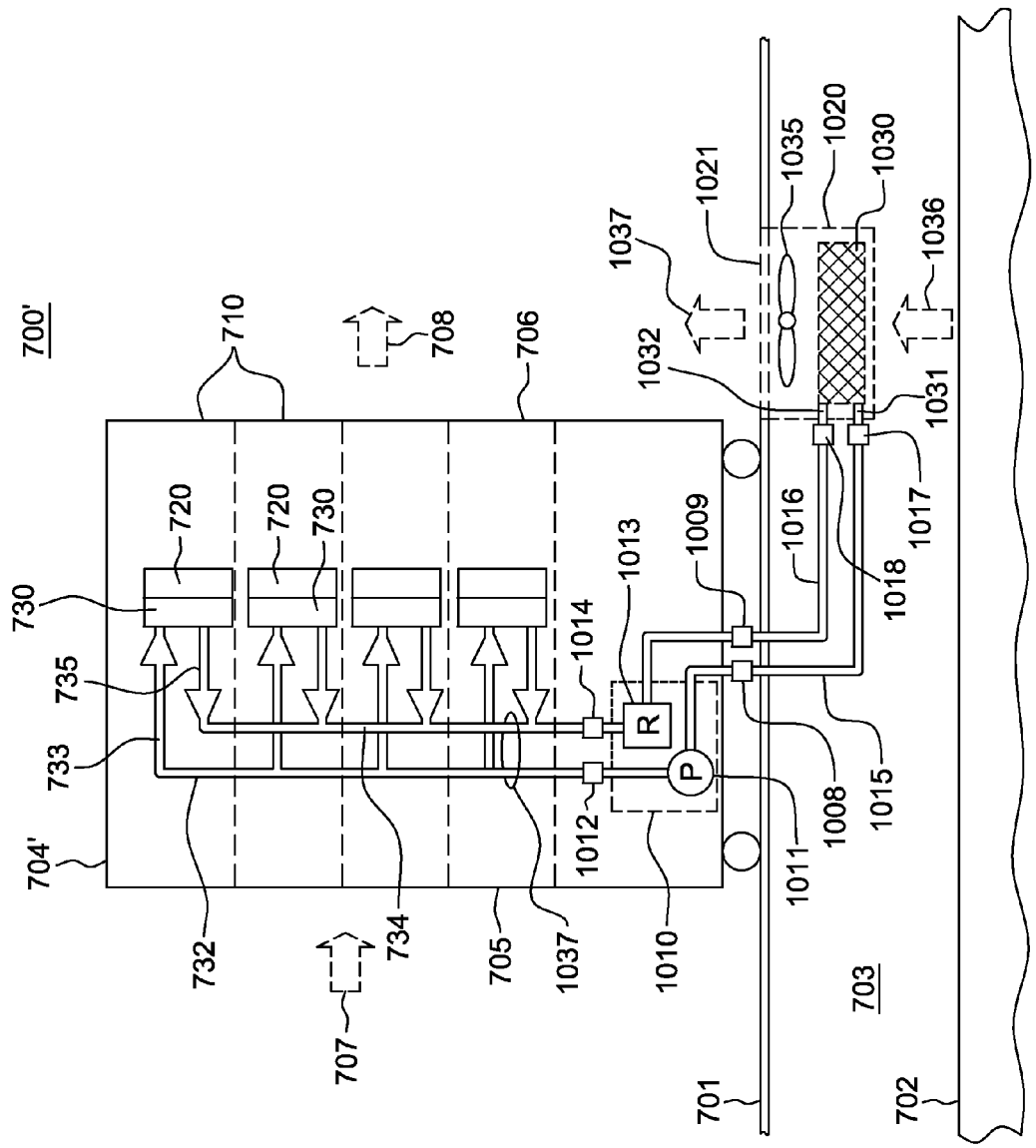
FIG. 10 is a cross-sectional elevational illustration of an alternate embodiment of an electronics rack within a raised floor data center and an apparatus for facilitating cooling of one or more components of the electronics rack, in accordance with an aspect of the present invention.

FIG. 10 illustrates an alternate implementation of the cooling apparatus of FIGS. 7-9C. In this implementation, a single modular tile assembly 1020 is provided which defines, in part, cool air plenum 703 of air-cooled data center 700', and a coolant pumping unit 1010, comprising a coolant pump 1011 and a reservoir 1013 in fluid communication with a coolant loop 1037, and disposed in a lower portion of electronics rack 704'. Integration of coolant pumping unit 1010 within electronics rack 704' advantageously minimizes external setup of the cooling apparatus. In the embodiment illustrated, quick connects 1012 and 1014 respectively couple in fluid communication coolant supply manifold 732 and coolant return manifold 734 with coolant pump 1011 and reservoir 1013. Additional liquid coolant lines 1015 and 1016 couple via respective quick connects 1008, 1017, 1018 and 1009, coolant pumping unit 1010 and the modular tile assembly 1020, and in particular, respective coolant inlet and coolant outlet lines 1031, 1032 of liquid-to-air heat exchanger 1030 thereof. As shown, in operation, cool air 1036 within the cool air plenum 703 is drawn across liquid-to-air heat exchanger 1030 of modular tile assembly 1020 via air-moving device 1035 and exhausted as heated air 1037 through the perforated tile 1021 of the modular tile assembly 1020 into, for example, a hot air aisle of data center 700'.

Figure 11A:
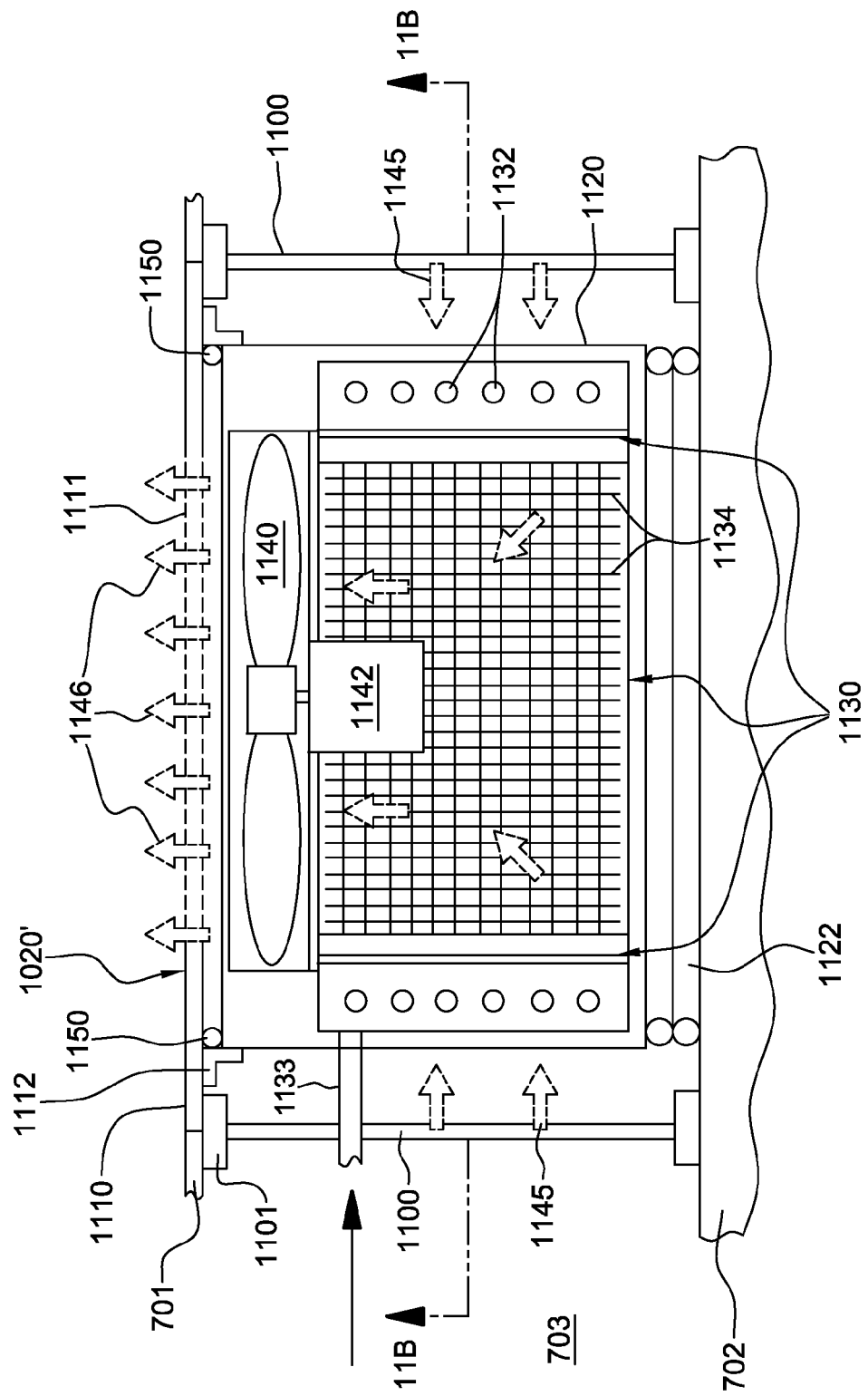
FIG. 11A is a cross-sectional elevational view of one embodiment of a modular tile assembly of an apparatus such as illustrated in FIG. 10, comprising an air-moving device and multiple liquid-to-air heat exchangers, and taken along line 11A-11A in the cross-sectional plan view thereof of FIG. 11B, in accordance with an aspect of the present invention.
Figure 11B:
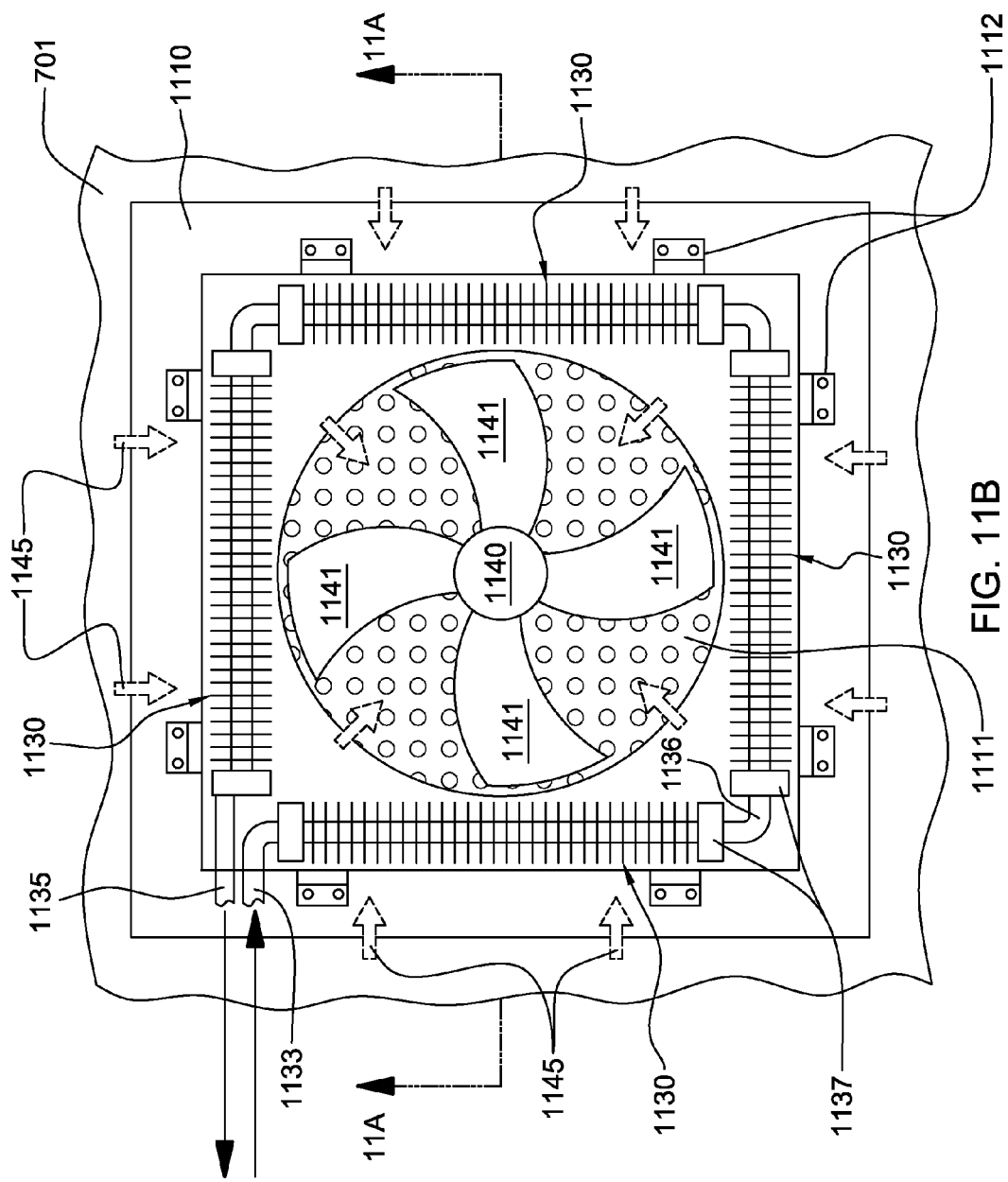
FIG. 11B is a cross-sectional plan view of the modular tile assembly of FIG. 11A, taken along line 11B-11B thereof, in accordance with an aspect of the present invention.

FIGS. 11A & 11B depict one specific example of a modular tile assembly 1020' for use with a cooling apparatus such as depicted in FIG. 10. In this embodiment, modular tile assembly 1020' includes a perforated tile 1111 having a lip 1110 which resides on a raised floor support structure 1101 supported by respective struts 1100. Mounting brackets 1112 and an air-seal gasket 1150 couple a support structure 1120 to the underside of perforated tile 1111 within cool air plenum 703 defined between raised floor 701 and base floor 702 of the raised floor data center. In the implementation depicted in FIGS. 11A & 11B, a multi-sided heat exchanger 1130 is provided within the support structure 1120. This multi-sided heat exchanger defines a central opening over which is aligned air-moving device 1140 driven by motor 1142. As illustrated, cool air 1145 within cool air plenum 703 is drawn through the sides of the multi-sided heat exchanger 1130 by air-moving device 1140 and is exhausted 1146 into the data center through the perforations in perforated tile 1111.

As noted, the support structure 1120 containing the multi-sided heat exchanger(s) 1130 and fan assembly 1140 is attached to the underside of the (removable) perforated tile 1111 by respective mounting brackets 1112, allowing the entire assembly to be dropped into position when the modular tile assembly is put into place. Further support is provided via an inflatable tube (or ring) 1122 adhesively joined to the lower surface of support structure 1120 and having a similar plan form as the structure. Once the modular tile assembly is positioned in place, inflatable tube 1122 may be inflated to carry some of the weight of the modular tile assembly. If the bottom of the support structure is open, for example, to minimize weight of the assembly, inflatable tube 1122 also acts as an air seal to prevent airflow bypass around the heat exchanger(s) 1130.

In the depicted embodiment, the heat exchanger comprises four separate liquid-to-air heat exchangers fluidically coupled together in serial fashion via respective tubings 1136 and quick connects 1137. Coolant inlet line 1133 and coolant outlet line 1135 are shown at one corner of the multi-sided heat exchanger 1130. In an alternate implementation, the heat exchangers could be coupled together in parallel or in a series-parallel combination. Also shown in this figure are blades 1141 of air-moving device 1140 and the perforations in perforated tile 1111.

Those skilled in the art should note that, although not depicted in FIGS. 11A & 11B, the modular tile assembly illustrated could be mounted in a similar manner to a ceiling tile in those data center implementations where cool air is delivered via a ceiling or other overhead cool air plenum.

In the cooling embodiments depicted in FIGS. 7 & 10, cool airflow through the electronics rack is in parallel with cool airflow through the liquid-to-air heat exchanger of the cooling apparatus. This is beneficial in those cases where the air-cooled components of the electronics rack require the coolest available air for cooling. However, since a significant portion of the electronics rack load might be removed through the liquid cooling apparatus described herein, the air-cooled components might not require very cool air for satisfactory cooling. Also, the use of a modular tile assembly disposed to exhaust air into the hot air aisle of the data center means that floor space at the air outlet side and the air inlet side of the electronics rack will need to be occupied by perforated tile(s). This is acceptable if the space is available. However, floor space may be a constraining factor. In general, in a raised floor, air-cooled data center, there will typically be one or more perforated tiles already at the air inlet side of each electronics rack to facilitate providing cool air from the cool air plenum to the air inlet side of the rack for air-cooling components within the rack.

Figure 12:
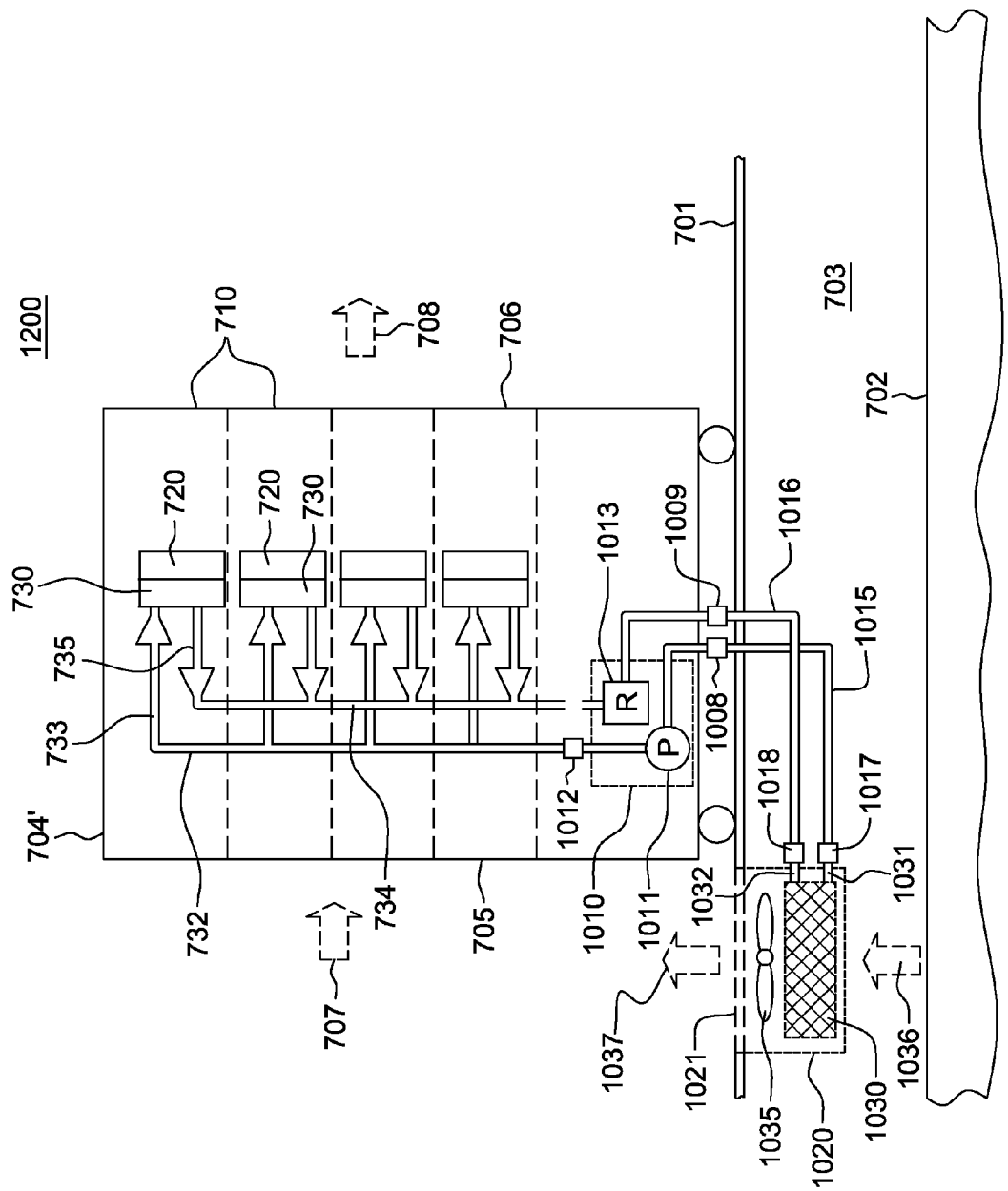
FIG. 12 is a cross-sectional elevational illustration of another embodiment of an electronics rack within a raised floor data center and an apparatus for facilitating cooling of one or more components of the electronics rack, in accordance with an aspect of the present invention.

FIG. 12 thus illustrates an alternate implementation to the structure of FIG. 10, wherein the modular tile assembly 1020 is disposed at the air inlet side 705 of the electronics rack 704'. In this implementation, there is necessarily a certain amount of preheating of the cool air exiting perforated tile 1021 and being drawn into the air inlet side 705 of electronics rack 704' for cooling the air-cooled components of the rack. Assuming that this is acceptable, the implementation of FIG. 12 could be beneficial in those instances where less floor space is available for perforated tiles. In addition, the air leaving the electronics rack at the air outlet side will be hotter, which may lead to an enhanced cooling capability for the room air-conditioning units.

Figure 13:
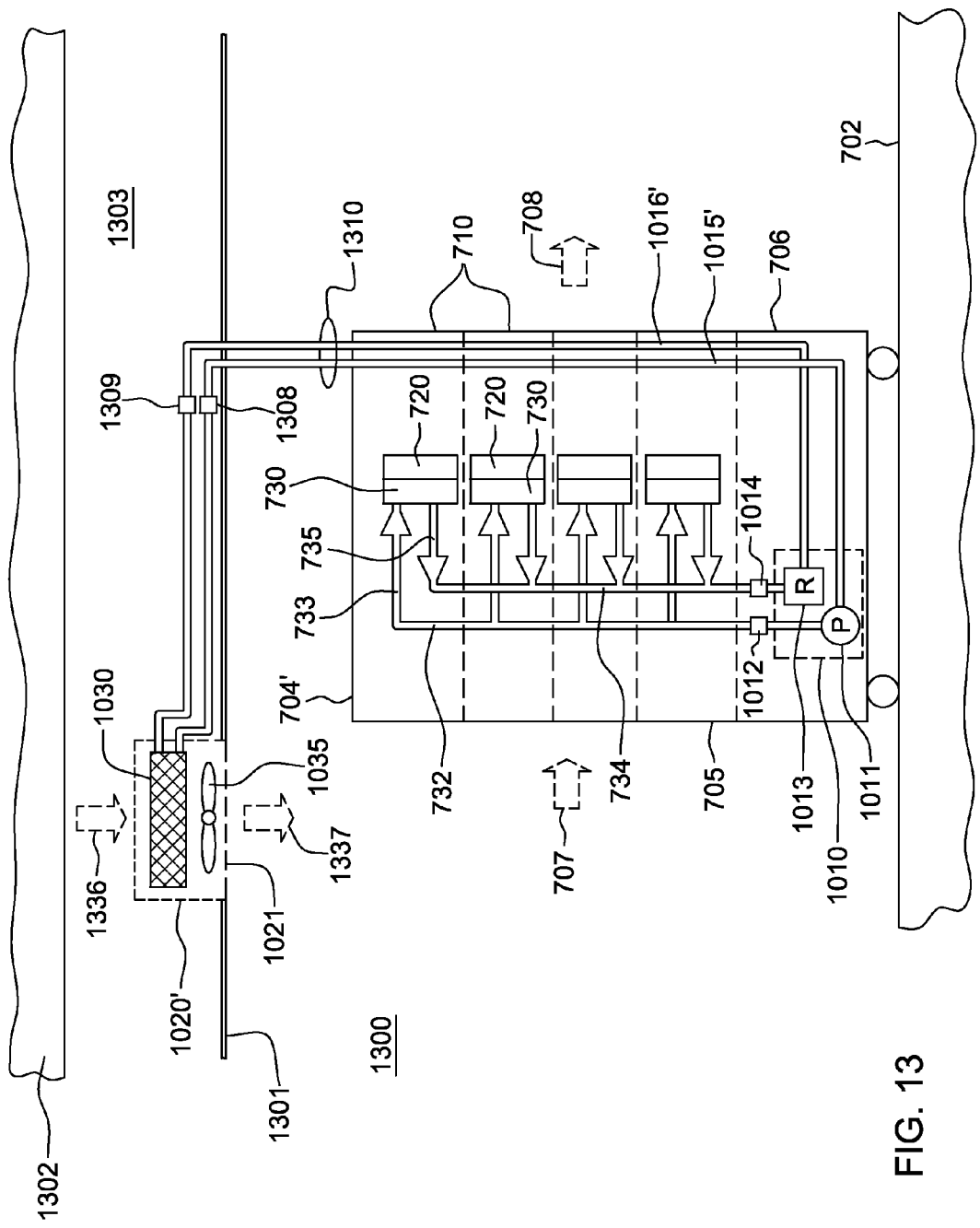
FIG. 13 is a cross-sectional elevational illustration of one embodiment of an electronics rack within a non-raised floor data center and an apparatus for facilitating cooling of one or more components of the electronics rack, in accordance with an aspect of the present invention.

FIG. 13 illustrates a variation on the cooling apparatus embodiments of FIGS. 10 & 12, wherein the electronics rack 704' is disposed within a non-raised floor data center 1300, and cool air is provided to air inlet side 705 of electronics rack 704' via a cool air plenum 1303 defined between a drop ceiling 1301 and a base ceiling 1302. In this implementation, the cooling apparatus is substantially identical to that described above in connection with FIGS. 10 & 12, with cool air 1336 within cool air plenum 1303 being drawn across liquid-to-air heat exchanger 1030 by air-moving device 1035 for exhausting as slightly warmer air 1337 into data center 1300 at, for example, the air inlet side of the electronics rack. As depicted, the cooling apparatus includes a coolant loop 1310 comprising coolant supply and return lines 1015', 1016', which extend upwards (from, for example, a lower portion of the electronics rack containing coolant pumping unit 1010) to the modular tile assembly 1020, with the perforated tile 1021 thereof forming a portion of cool air plenum 1303 and the heat exchanger and air-moving device assemblies thereof extending away from the perforated tile into the cool air plenum. Note that the liquid coolant lines 1015', 1016' may be routed through the electronics rack, or through a door of the electronics rack to the overhead ceiling plenum.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack, the apparatus comprising:
   at least one liquid-cooled structure associated with at least one electronic component of the electronics rack; and
   at least one liquid-to-air heat exchanger coupled in fluid communication with the at least one liquid-cooled structure via a coolant loop for receiving heated coolant after passing through the at least one liquid-cooled structure, the at least one liquid-to-air heat exchanger being external to and detached from the electronics rack, the at least one liquid-to-air heat exchanger being disposed within a cool air plenum coupled to an air-cooling source and receiving cooled air therefrom, the cool air plenum being external to the electronics rack, wherein cooled air within the cool air plenum passes across the at least one liquid-to-air heat exchanger, and the at least one liquid-to-air heat exchanger cools coolant passing therethrough by dissipating heat from the coolant passing therethrough to the cooled air passing thereacross; and
   wherein the cool air plenum comprises one of an underfloor plenum or an overhead plenum within a data center containing the electronics rack, the cool air plenum providing cooled air to the data center, and wherein the electronics rack is an air-cooled electronics rack.

2. The apparatus of claim 1, wherein the at least one liquid-to-air heat exchanger is associated with and accessible via at least one modular tile assembly defining, in part, the cool air plenum, the cool air plenum being one of the underfloor plenum or overhead plenum within a data center containing the electronics rack.

3. The apparatus of claim 1, wherein the at least one liquid-to-air heat exchanger is part of at least one modular tile assembly defining, in part, the cool air plenum, and is removable with the at least one modular tile assembly, the cool air plenum being one of the underfloor plenum or overhead plenum within a data center containing the electronics rack.

4. The apparatus of claim 3, wherein the at least one liquid-to-air heat exchanger is associated with a first modular tile assembly defining, in part, the cool air plenum, and the apparatus further comprises an air-moving device associated with a second modular tile assembly defining, in part, the cool air plenum, wherein the first modular tile assembly and the second modular tile assembly are adjacent tile assemblies defining, in part, the cool air plenum, and the air-moving device facilitates cool air movement across the at least one liquid-to-air heat exchanger of the first modular tile assembly.

5. The apparatus of claim 4, further comprising a pump and a reservoir in fluid communication with the coolant loop, the pump pumping coolant through the coolant loop, and the pump and the reservoir being associated with a third modular tile assembly defining, in part, the cool air plenum.

6. The apparatus of claim 4, wherein the air-moving device is part of the second modular tile assembly, and the second modular tile assembly includes a perforated tile, the air-moving device being disposed relative to the perforated tile to move air passing across the at least one liquid-to-air heat exchanger through the perforated tile into the data center.

7. The apparatus of claim 6, further comprising at least one air baffle associated with at least one of the first modular tile assembly or the second modular tile assembly, the at least one air baffle being configured to facilitate directing air passing across the at least one liquid-to-air heat exchanger towards the air-moving device for facilitating exhausting thereof into the data center through the perforated tile.

8. The apparatus of claim 7, wherein the first modular tile assembly comprises a solid surface tile and the at least one liquid-to-air heat exchanger is oriented to extend substantially parallel with the solid surface tile, and wherein the at least one air-moving device of the second modular tile assembly comprises blades extending within a plane oriented substantially parallel with the perforated tile of the second modular tile assembly.

9. The apparatus of claim 1, wherein the at least one liquid-to-air heat exchanger is associated with at least one modular tile assembly defining, in part, the cool air plenum, the cool air plenum being one of an underfloor plenum or overhead plenum within a data center containing the electronics rack, and wherein the apparatus further comprises at least one air-moving device associated with the at least one modular tile assembly, the at least one modular tile assembly including a perforated tile, and the at least one air-moving device being aligned to the perforated tile for facilitating moving air passing across the at least one liquid-to-air heat exchanger through the perforated tile into the data center.

10. The apparatus of claim 9, wherein the at least one liquid-to-air heat exchanger is oriented to extend substantially parallel to the perforated tile, and the at least one air-moving device is disposed between the at least one liquid-to-air heat exchanger and the perforated tile.

11. The apparatus of claim 9, wherein the at least one liquid-to-air heat exchanger extends away from the perforated tile into the cool air plenum and is configured with a transverse cross-sectional shape comprising a central opening, the at least one air-moving device being aligned to the central opening to facilitate drawing air across the at least one liquid-to-air heat exchanger and exhausting of the air passing threreacross through the perforated tile.

12. The apparatus of claim 11, wherein the apparatus comprises multiple liquid-to-air heat exchangers coupled in fluid communication with the coolant loop, the multiple liquid-to-air heat exchangers extending away from the perforated tile into the cool air plenum, and being disposed to together define the transverse cross-sectional shape with the central opening.

13. The apparatus of claim 12, wherein the multiple liquid-to-air heat exchangers comprise four liquid-to-air heat exchangers coupled in fluid communication and extending away from the perforated tile into the cool air plenum, the four liquid-to-air heat exchangers being coupled together in a rectangular-shaped, transverse cross-sectional configuration.

14. A data center comprising:
an electronics rack;
a cool air plenum, the cool air plenum comprising one of an underfloor plenum or overhead plenum providing cooled air to the data center, the cool air plenum being coupled to an air-cooling source for the data center for receiving cooled air therefrom; and
an apparatus for facilitating cooling of at least one electronic component of the electronics rack, the apparatus comprising:
at least one liquid-cooled structure associated with the at least one electronic component of the electronics rack; and
at least one liquid-to-air heat exchanger coupled in fluid communication with the at least one liquid-cooled structure via a coolant loop for receiving heated coolant after passing through the at least one liquid-cooled structure, the at least one liquid-to-air heat exchanger being configured for disposition external to the electronics rack within the cool air plenum coupled to the air-cooling source, wherein cooled air within the cool air plenum passes across the at least one liquid-to-air heat exchanger, and the at least one liquid-to-air heat exchanger cools coolant passing therethrough by dissipating heat from the coolant passing therethrough to the cooled air passing thereacross.

15. The data center of claim 14 wherein the at least one liquid-to-air heat exchanger is associated with a first modular tile assembly defining, in part, the cool air plenum, and the apparatus further comprises an air-moving device associated with a second modular tile assembly defining, in part, the cool air plenum, wherein the first modular tile assembly and the second modular tile assembly are adjacent tile assemblies defining, in part, the cool air plenum, and the air-moving device facilitates cool air movement across the at least one liquid-to-air heat exchanger of the first modular tile assembly, and wherein the apparatus further comprises at least one air baffle associated with at least one of the first modular tile assembly or the second modular tile assembly, the at least one air baffle being configured to facilitate directing air passing across the at least one liquid-to-air heat exchanger towards the air-moving device for facilitating exhausting thereof into the data center through the perforated tile.

16. The data center of claim 15, wherein the first modular tile assembly comprises a solid surface tile and the at least one liquid-to-air heat exchanger is oriented to extend substantially parallel with the solid surface tile, and wherein the at least one air-moving device of the second modular tile assembly comprises blades extending within a plane oriented substantially parallel with the perforated tile of the second modular tile assembly.

17. The data center of claim 14, wherein the at least one liquid-to-air heat exchanger is associated with at least one modular tile assembly defining, in part, the cool air plenum, the cool air plenum being one of an underfloor plenum or overhead plenum within a data center containing the electronics rack, and wherein the apparatus further comprises at least one air-moving device associated with the at least one modular tile assembly, the at least one modular tile assembly including a perforated tile, and at least one air-moving device being aligned to the perforated tile for facilitating moving air passing across the at least one liquid-to-air heat exchanger through the perforated tile into the data center, and wherein the at least one liquid-to-air heat exchanger is oriented to extend substantially parallel to the perforated tile, and the at least one air-moving device is disposed between the at least one liquid-to-air heat exchanger and the perforated tile.

18. The data center of claim 14, wherein the at least one liquid-to-air heat exchanger is associated with at least one modular tile assembly defining, in part, the cool air plenum, and wherein the apparatus further comprises at least one air-moving device associated with the at least one modular tile assembly, the at least one modular tile assembly including a perforated tile, and the at least one air-moving device being aligned to the perforated tile for facilitating moving air passing across the at least one liquid-to-air heat exchanger through the perforated tile into the data center, and wherein the at least one liquid-to-air heat exchanger extends away from the perforated tile into the cool air plenum and is configured with a transverse cross-sectional shape comprising a central opening, the at least one air-moving device being aligned to the central opening to facilitate drawing air across the at least one liquid-to-air heat exchanger and exhausting of the air passing thereacross through the perforated tile.

19. A method of facilitating cooling of an electronics rack, the method comprising:
disposing at least one tile assembly external to the electronics rack, the at least one tile assembly defining, in part, a cool air plenum of a data center containing the electronics rack, and comprising at least one liquid-to-air heat exchanger extending away from a tile thereof into the cool air plenum, the cool air plenum being coupled to an air-cooling source for the data center and receiving cooled air therefrom;
associating at least one liquid-cooled structure with at least one electronic component of the electronics rack to facilitate removal of heat therefrom via liquid coolant passing therethrough, and coupling in fluid communication, via a coolant loop, the at least one liquid-cooled structure and the at least one liquid-to-air heat exchanger, wherein the at least one liquid-to-air heat exchanger receives coolant from and supplies coolant to the at least one liquid-cooled structure; and
wherein in operation, cool air of the cool air plenum passes across the at least one liquid-to-air heat exchanger, and the at least one liquid-to-air heat exchanger cools coolant passing therethrough by dissipating heat from the coolant passing therethrough to the cooled air passing thereacross.

\* \* \* \* \*